(12) United States Patent
Ham et al.

(10) Patent No.: US 10,051,766 B2
(45) Date of Patent: Aug. 14, 2018

(54) ELECTROMAGNETIC WAVE SHIELDING STRUCTURE AND DISPLAY DEVICE INCLUDING THE SAME

(71) Applicant: LG Display Co., Ltd., Seoul (KR)

(72) Inventors: Jong-Sik Ham, Gyeonggi-do (KR); Dae-Sung Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 59 days.

(21) Appl. No.: 15/176,568

(22) Filed: Jun. 8, 2016

(65) Prior Publication Data
US 2017/0034960 A1 Feb. 2, 2017

(30) Foreign Application Priority Data

Jul. 31, 2015 (KR) .................. 10-2015-0109039

(51) Int. Cl.
| | |
|---|---|
| G09F 13/04 | (2006.01) |
| G09F 13/08 | (2006.01) |
| H05K 9/00 | (2006.01) |
| G02F 1/1333 | (2006.01) |

(52) U.S. Cl.
CPC ..... *H05K 9/0015* (2013.01); *G02F 1/133308* (2013.01); *G02F 2001/133334* (2013.01); *G02F 2202/22* (2013.01)

(58) Field of Classification Search
CPC ... G02F 1/133308; G02F 2001/133334; G02F 2202/22; H05K 9/0015
See application file for complete search history.

(56) References Cited

U.S. PATENT DOCUMENTS

| | | | | |
|---|---|---|---|---|
| 4,857,668 A * | 8/1989 | Buonanno | ............ | H05K 9/0015 174/354 |
| 5,142,101 A * | 8/1992 | Matsuzaki | ........... | H05K 9/0015 174/354 |
| 5,569,877 A * | 10/1996 | Yumi | ................... | H05K 9/0015 174/354 |
| 5,804,762 A * | 9/1998 | Jones | ................... | H05K 9/0015 174/358 |
| 6,175,396 B1 * | 1/2001 | Kim | .................. | G02F 1/133308 349/58 |
| 6,411,353 B1 * | 6/2002 | Yarita | ............... | G02F 1/133308 349/150 |
| 6,504,586 B1 * | 1/2003 | Lee | ..................... | G02F 1/13452 349/58 |

(Continued)

*Primary Examiner* — Tsion Tumebo
(74) *Attorney, Agent, or Firm* — Morgan, Lewis & Bockius LLP (57) ABSTRACT

An electromagnetic wave shielding structure includes a conductive cover, a circuit board disposed on the conductive cover, a gasket mounted on the circuit board to contact the circuit board and having an opening, and a conductive holder protruding from the conductive cover so as to be inserted through the opening in the gasket and contacting the gasket, wherein the gasket includes an elastic member an internal space communicating with the opening, and a conductive member applied to the elastic member, wherein the conductive members applied to the outer and inner surfaces of the elastic member are connected to each other, and wherein the conductive member applied to the outer surface contacts the circuit board, and the conductive member applied to the inner surface contacts the conductive holder.

10 Claims, 7 Drawing Sheets

(56) References Cited

U.S. PATENT DOCUMENTS

| | | | | |
|---|---|---|---|---|
| 6,583,831 B2* | 6/2003 | Kim | G02F 1/13452 | 349/149 |
| 6,903,794 B2* | 6/2005 | Fukuta | G02F 1/13452 | 349/150 |
| 6,972,963 B1* | 12/2005 | Chou | H01L 23/4985 | 174/252 |
| 7,602,467 B2* | 10/2009 | Lee | G02F 1/13452 | 349/149 |
| 7,660,105 B2* | 2/2010 | Hwang | H05K 5/0247 | 248/309.1 |
| 7,931,475 B2* | 4/2011 | Kim | H01R 12/57 | 439/66 |
| 8,031,291 B2* | 10/2011 | Won | G02F 1/133308 | 349/150 |
| 9,274,374 B2* | 3/2016 | Jee | H01R 13/2442 | |
| 2003/0043310 A1* | 3/2003 | Cho | G02B 6/0086 | 349/58 |
| 2003/0169383 A1* | 9/2003 | Kim | G02B 6/0088 | 349/58 |
| 2005/0194913 A1* | 9/2005 | Kim | H05K 5/02 | 315/169.4 |
| 2005/0286228 A1* | 12/2005 | Kim | H05K 7/20963 | 361/704 |
| 2009/0033825 A1* | 2/2009 | Fukayama | G02F 1/133308 | 349/58 |
| 2009/0168314 A1* | 7/2009 | Park | G02F 1/133308 | 361/679.02 |
| 2009/0185102 A1* | 7/2009 | Lee | G02F 1/13452 | 349/58 |
| 2010/0265426 A1* | 10/2010 | Jeon | G02F 1/133308 | 349/58 |
| 2012/0099044 A1* | 4/2012 | Lin | G02F 1/133308 | 349/58 |
| 2013/0141664 A1* | 6/2013 | Toyoyama | G02F 1/1333 | 349/59 |
| 2015/0241730 A1* | 8/2015 | Kondoh | G02F 1/133608 | 348/794 |

* cited by examiner

ELECTROMAGNETIC WAVE SHIELDING STRUCTURE AND DISPLAY DEVICE INCLUDING THE SAME

This application claims the benefit of Korean Patent Application No. 10-2015-0109039, filed on Jul. 31, 2015, which is hereby incorporated by reference as if fully set forth herein.

BACKGROUND OF THE INVENTION

Field of the Invention

The present invention relates to an electromagnetic wave shielding structure capable of shielding electromagnetic waves with or without a cover shield being provided and a display device including the same.

Discussion of the Related Art

A liquid crystal display (hereinafter, referred to as LCD) displays an image through a pixel matrix employing the electrical and optical properties of liquid crystals, which exhibit anisotropy from the aspects of index of refraction and permittivity. Each of the pixels of an LCD realizes gradation by controlling the transmissibility of light transmitted through a polarization plate by varying the liquid crystal orientation in response to a data signal.

An LCD employs a gasket adapted to form a ground path between a printed circuit board (hereinafter referred to as a PCB) and a metal cover shield in order to block electromagnetic waves including electromagnetic interference (hereinafter referred to as EMI) and electrostatic discharge (hereinafter referred to as ESD).

Figure 1:
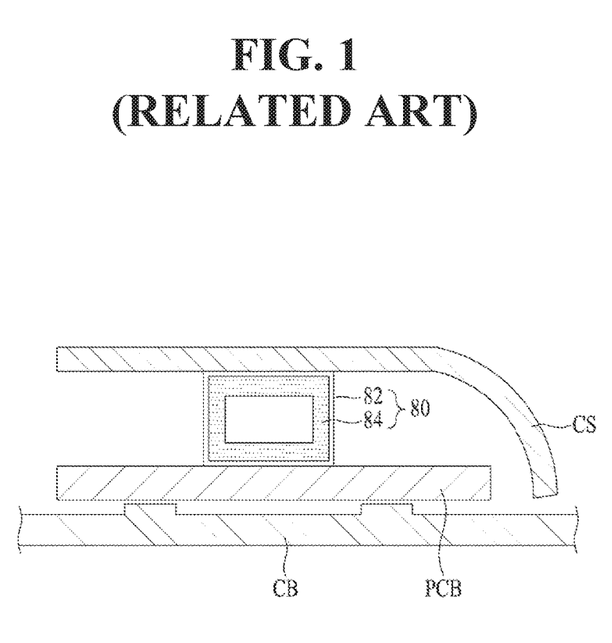
FIG. 1 is a cross-sectional view schematically illustrating a related art electromagnetic wave shielding structure for an LCD.

FIG. 1 is a cross-sectional view schematically illustrating a electromagnetic wave shielding structure of the related art for an LCD.

Referring to FIG. 1, an LCD includes a PCB disposed between a bottom cover CB and a cover shield CS, and a gasket 80 is mounted on the PCB so as to contact the cover shield CS for electrical connection thereto. The gasket 80 includes a rubber 84 and a metal film 82 applied on the outer surface of the rubber 84. The metal film 82 of the gasket 80 contacts a ground pad of the PCB and the cover shield CS made of metal to form a ground path. Consequently, electromagnetic waves generated in the LCD are blocked by the earth connection through the ground path.

However, since the LCD of the related art necessarily requires the metal cover shield CS, which contacts the gasket 80, and since the gasket 80 and the metal cover shield CS have to be assembled in order to precisely contact each other in order to block electromagnetic waves, there are restrictions in size reduction, design freedom and cost reduction.

Since an electromagnetic wave shielding structure including a gasket may be applied not only to an LCD but also to various display devices such as an organic light emitting diode (hereinafter, referred to as OLED) and various electronic appliances such as a computer, the electromagnetic wave shielding structure according to the present invention is not limited to a display device, and the display device according to the present invention is not limited to an LCD.

SUMMARY

Accordingly, the present invention is directed to an electromagnetic wave shielding structure and a display device having the same that substantially obviate one or more of the problems due to limitations and disadvantages of the related art An object of the present invention is to provide an electromagnetic wave shielding structure capable of blocking electromagnetic waves by forming a ground path regardless of whether or not a cover shield is provided and a display device including the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an electromagnetic wave shielding structure comprises a conductive cover, a circuit board disposed on a surface of the conductive cover, a gasket mounted on the circuit board so as to electrically contact the circuit board, the gasket having an opening therein, and a conductive holder protruding from the conductive cover so as to be inserted through the opening in the gasket and is coupled thereto, the conductive holder electrically contacting the gasket.

In another aspect, a display device comprises a display panel, a conductive cover disposed behind the display panel, a circuit board electrically connected to the display panel via a circuit film including a driver mounted thereon, the circuit board being disposed on an outer surface of the conductive cover, a gasket mounted on the circuit board so as to electrically contact the circuit board, the gasket having an opening therein, and a conductive holder projecting from the conductive cover and being inserted through the opening in the gasket so as to be coupled to the gasket, the conductive holder electrically contacting the gasket.

The gasket may include an elastic member having the opening and an internal space communicating with the opening, and a conductive member applied to outer and inner surfaces of the elastic member. The conductive member applied to the outer surface of the elastic member and the conductive member applied to the inner surface of the elastic member may be connected to each other. The conductive member applied to the outer surface of the elastic member electrically may contact the circuit board, and the conductive member applied to the inner surface of the elastic member electrically may contact the conductive holder inserted through the opening.

The opening may be positioned in a lower part of the gasket, which contacts a ground pad on the circuit board, and the circuit board has a through hole communicating with the opening of the gasket. The conductive holder projecting from the conductive cover may be inserted in the internal space in the gasket through the through hole in the circuit board and the opening in the gasket so as to directly contact the conductive member applied to the opening of the gasket and to hold the circuit board to the conductive cover.

The gasket may include a lower part contacting a ground pad on the circuit board, an upper part facing the lower part, and two lateral wall parts connected to each other via the lower part and the upper part. The opening in the gasket may be positioned in one of the two lateral wall parts, and the conductive holder, projecting from the conductive cover, may be disposed near an end of the circuit board and may be inserted into the internal space in the gasket through the opening in the gasket so as to directly contact the conductive member applied to the opening in the gasket and to hold the circuit board to the conductive cover.

In the electromagnetic wave shielding structure according to the present invention, the conductive holder mounted on the conductive cover is inserted into and coupled to the internal space in the gasket mounted on the circuit board, and comes into contact with the inner conductive member of the gasket. As a result, by virtue of the coupling structure between the conductive holder and the gasket, the circuit board can also be held. In addition, it is possible to block electromagnetic waves using the ground path formed between the circuit board and the conductive cover.

Consequently, the display device including the electromagnetic wave shielding structure according to the present invention is able to obviate a cover shield, which comes into contact with the outer conductive member of the gasket, and to obviate or minimize holding members for holding the circuit board to the conductive cover, thereby reducing manufacturing costs and increasing design freedom.

Alternatively, the display device including the electromagnetic wave shielding structure according to the present invention may further include a cover shield, which comes into contact with the outer conductive film of the gasket. In this case, the surface area of the ground path is increased, thereby improving the grounding performance.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, example embodiments of the present invention will be described in detail with reference to FIGS. 2 to 7.

Figure 2A:
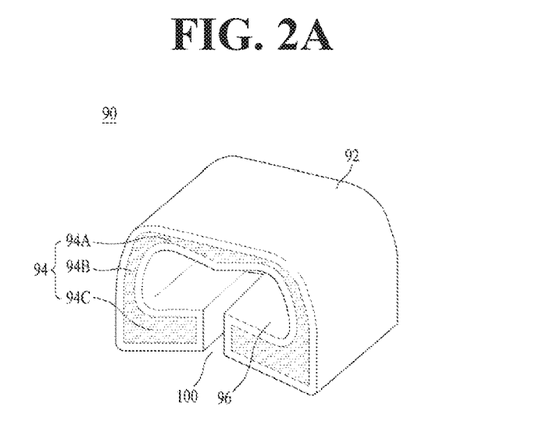
FIGS. 2A to 2C are views illustrating an electromagnetic wave shielding structure according to a first example embodiment of the present invention.
Figure 2B:
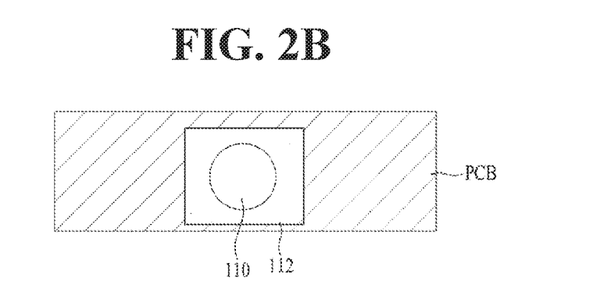
Figure 2C:
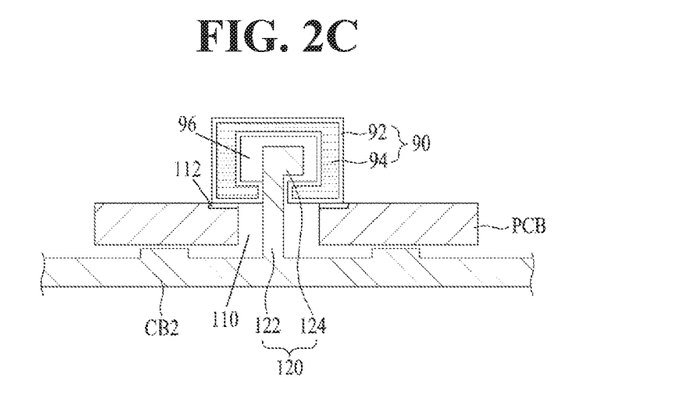

FIGS. 2A to 2C are views illustrating an electromagnetic wave shielding structure according to a first embodiment of the present invention.

A gasket 90, which is illustrated in FIG. 2A, includes an elastic member 94 having therein an internal space 96 and an opening 100, and a conductive member 92 applied to the surface of the elastic member 94, that is, the outer and inner surfaces of the elastic member 94, which are connected to each other.

The elastic member 94 includes an upper part 94A, two lateral wall parts 94B and a lower part 94C, which are integrally formed so as to surround the internal space 96. The opening 100 is formed through the lower part 94C so as to communicate with the internal space 96, and the lower part 94C is thus divided into two segments by the opening 100. The corners between the upper part 94A and the lateral wall parts 94B and the corners between the lateral wall parts 94B and the lower part 94C may be rounded. The elastic member 94 is made of an elastic material such as silicon rubber.

The conductive member 92 is applied to both the outer and inner surfaces of the elastic member 94 such that the conductive member 92 applied to the outer surface of the elastic member 94 and the conductive member 92 applied to the inner surface of the elastic member 94 are integrally connected to each other. Since the conductive member 92 is applied to all of the outer and inner surfaces of the upper part 94A, the outer and inner surfaces of the lateral wall parts 94B and the outer and inner surfaces of the lower part 94C, the conductive member 92 is configured so as to have an integrally connected form.

The conductive member 94 may be attached to the outer and inner surfaces of the elastic member 94 by means of an adhesive such as silicone adhesive.

The conductive member 92 may also be applied to both the front and rear surfaces of the elastic member 94 illustrated in FIG. 2A.

A PCB, which is illustrated in FIGS. 2B and 2C, includes a ground pad 112, which is positioned at the area on which the gasket 90 is mounted and which comes into electric contact with the conductive member 92 on the outer surface of the lower part of the gasket 90, and a through hole 110 through which a conductive holder 120 mounted on a conductive bottom cover CB is inserted. The gasket 90 is mounted on the PCB through surface mount technology (SMT) such that the opening 100 in the gasket 90 communicates with the through hole 100 in the PCB and such that the conductive member 92 on the outer surface of the gasket 90 comes into electric contact with the ground pad 112 of the PCB. A plurality of gaskets 90 may be mounted on the PCB.

The conductive holder 120 may be integrally formed with the conductive bottom cover CB, or may be electrically coupled to the conductive bottom cover CB by means of a coupling member (not shown). When the conductive holder 120 is integrally formed with the conductive bottom cover CB, the conductive bottom cover CB may be partially cut into a U-shaped slit so as to form a wing portion, and the wing portion may be bent twice so as to form a vertical part 122 and a horizontal part 124.

In other words, the conductive holder 120 includes the vertical part 122, which extends vertically from the conductive bottom cover CB, and the horizontal part 124, which extends horizontally from the end of the vertical part 122. The vertical part 122 and the horizontal part 124 of the conductive holder 120 are inserted into the internal space 96 in the gasket 90 through the through hole 110 in the PCB and the opening 100 in the gasket 90, which communicates with the through hole 110 in the PCB, with the result that the gasket 90 is coupled to the conductive holder 120 and that the conductive member 92, applied to the inner surface of the gasket 90, comes into electrical contact with the conductive holder 120.

Since the vertical part 122 of the conductive holder 120 is disposed in the through hole 110 in the PCB while being spaced apart from the PCB, the PCB may be moved in x and y directions by tension. Furthermore, since the conductive holder 120, which is disposed in the internal space 96 in the gasket 90, is spaced apart from the gasket 90, the PCB may also be moved in the z direction by tension.

Although FIG. 2C illustrates a structure in which only the vertical part 122 of the conductive holder 120 is in contact with the conductive member 92 on the inner surface of the gasket 90, the horizontal part 124 of the conductive holder 120, which is inserted into the internal space 96 in the gasket 90, may also be in contact with the conductive member 92 on the inner surface of the gasket 90.

Accordingly, the PCB may be held on the bottom cover CB by virtue of the coupling structure between the gasket 90 and the conductive holder 120. In addition, since there is formed a ground path, which extends through the ground pad 112 of the PCB, the conductive member 92 of the gasket 90, the conductive holder 120 and the conductive bottom cover CB, it is possible to block electromagnetic waves generated in the PCB or the like even without using a cover shield.

Figure 3A:
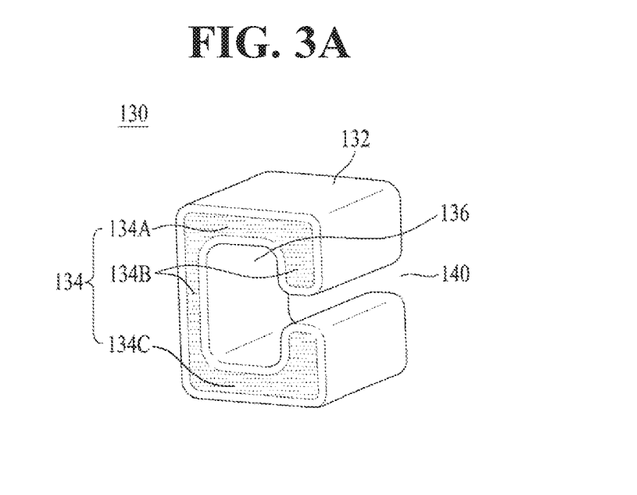
FIGS. 3A to 3C are views illustrating an electromagnetic shielding structure according to a second example embodiment of the present invention.
Figure 3B:
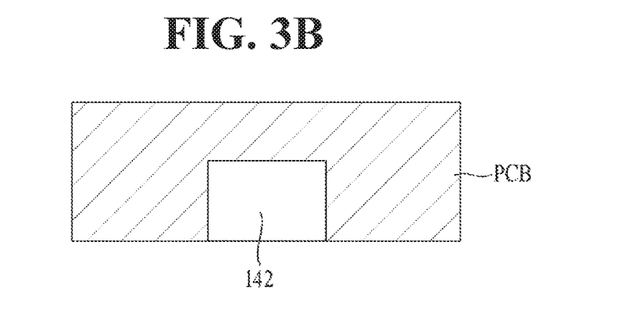
Figure 3C:
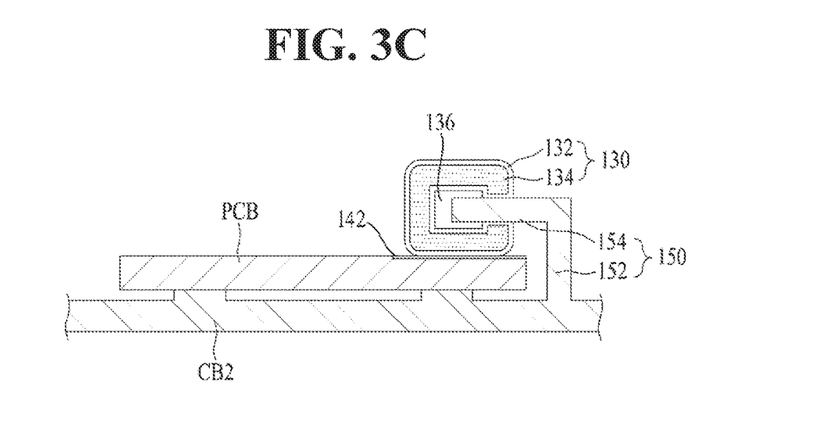

FIGS. 3A to 3C are views illustrating an electromagnetic shielding structure according to a second embodiment of the present invention.

A gasket 130, which is illustrated in FIG. 3A, includes an elastic member 134 having an internal space 136 and an opening 140, and a conductive member 132 applied to the surface of the elastic member 134, that is, outer and inner surfaces of the elastic member 134, which are connected to each other.

The elastic member 134 includes an upper part 134A, two lateral wall parts 134B and a lower part 134C, which are integrally formed so as to surround the internal space 136. The opening 140 is formed through one of the lateral wall parts 134B so as to communicate with the internal space 136, and the lateral wall part 134B is thus divided into two segments by the opening 140. The corners between the upper part 134A and the lateral wall parts 134B and the corners between the lateral wall parts 134B and the lower part 134C may be rounded. The all corners of the elastic member 134 may be rounded.

The conductive member 132 is applied to both the outer and inner surfaces of the elastic member 134 such that the conductive member 132 applied to the outer surface of the elastic member 134 and the conductive member 132 applied to the inner surface of the elastic member 134 are integrally connected to each other. The conductive member 132 may also be applied to both the front and rear surfaces of the elastic member 134 illustrated in FIG. 3A.

A PCB, which is illustrated in FIGS. 3B and 3C, includes a ground pad 142, which is positioned in the area on which the gasket 130 is mounted and which comes into electric contact with the conductive member 92 on the outer surface of the lower part of the gasket 130. The gasket 130 is mounted on the PCB through SMT such that the conductive member 132 on the outer surface of the gasket 130 comes into electric contact with the ground pad 142 of the PCB. A plurality of gaskets 130 may be mounted on the PCB.

A conductive holder 150 may be integrally formed with the conductive bottom cover CB, or may be electrically coupled to the conductive bottom cover CB by means of a coupling member (not shown). When the conductive holder 150 is integrally formed with the conductive bottom cover CB, the conductive bottom cover CB may be partially cut into a U-shaped slit so as to form a wing portion, and the wing portion may be bent twice so as to form a vertical part 152 and a horizontal part 154.

In other words, the conductive holder 150 includes the vertical part 152, which extends vertically from the conductive bottom cover CB, and the horizontal part 154, which extends horizontally from the end of the vertical part 152. The vertical part 152 of the conductive holder 150 extends while being positioned near the end of the PCB, and the horizontal part 154 of the conductive holder 150 is inserted into the internal space 136 in the gasket 130 through the opening 140 in the gasket 130. Consequently, the gasket 130 is coupled to the conductive holder 150, and the conductive member 132, applied to the inner surface of the gasket 130, comes into electric contact with the conductive holder 150. Specifically, the horizontal part 154 of the conductive holder 150 comes into electric contact with the regions of the conductive member 132 that face each other through the opening 140 in the gasket 130.

By virtue of the coupling structure between the gasket 130 and the conductive holder 150, the PCB may be held on the bottom cover CB. In addition, since there is formed a ground path, which extends through the ground pad 142 of the PCB, the conductive member 132 of the gasket 130, the conductive holder 150 and the conductive bottom cover CB, it is possible to block electromagnetic waves, generated in the PCB or the like, even without using a cover shield.

Accordingly, the display device including the electromagnetic wave shielding structure according to the present invention can obviate a cover shield, which contacts the outer conductive member of the gasket, and can obviate or minimize holding members for holding the PCB on the conductive bottom cover CB (clip, rib or the like), thereby reducing manufacturing costs and increasing a design freedom.

Alternatively, the display device including the electromagnetic wave shielding structure according to the present invention may further include a cover shield, which comes into electric contact with the outer conductive member of the gasket. In this case, the surface area of the ground path is increased, thereby increasing the grounding performance.

Figure 4:
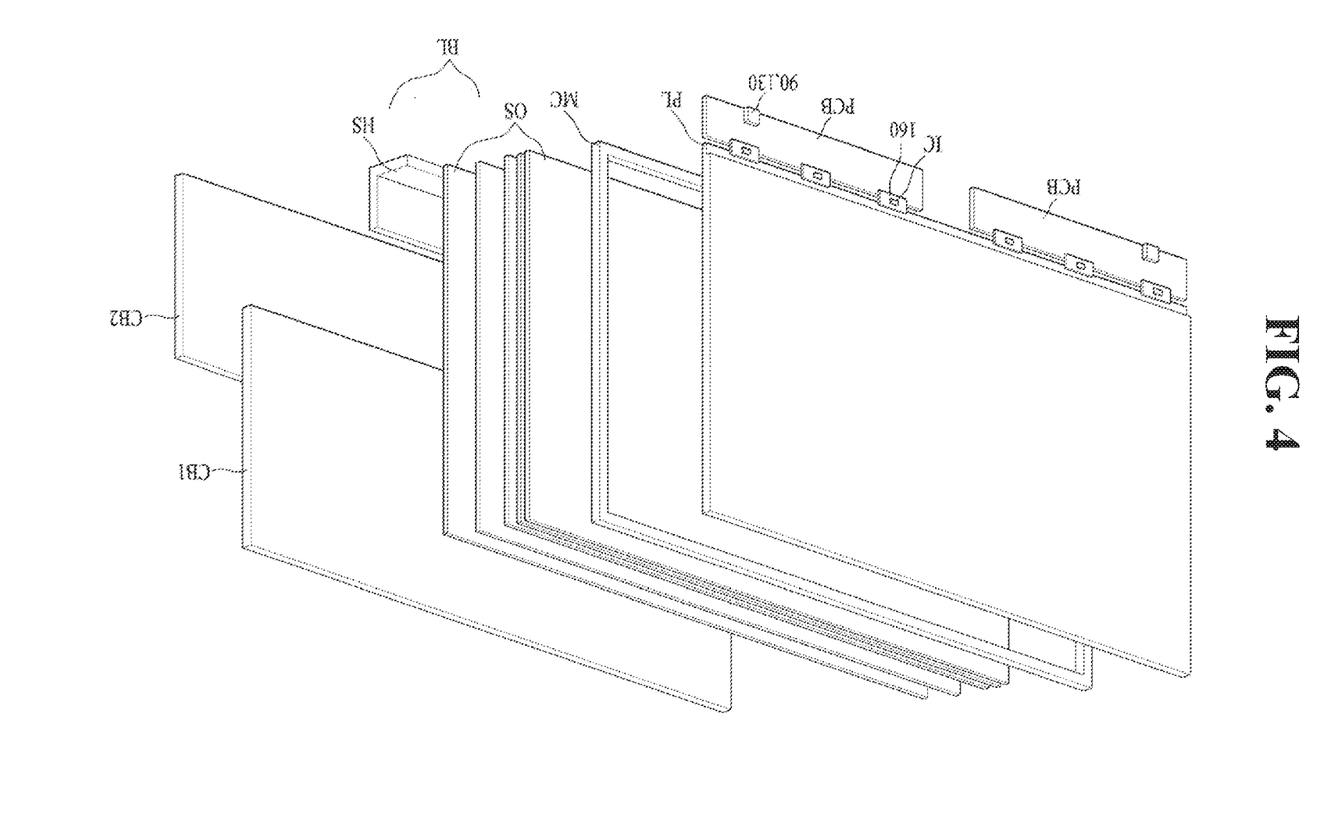
FIG. 4 is an exploded perspective view schematically illustrating an LCD according to an example embodiment of the present invention.
Figure 5:
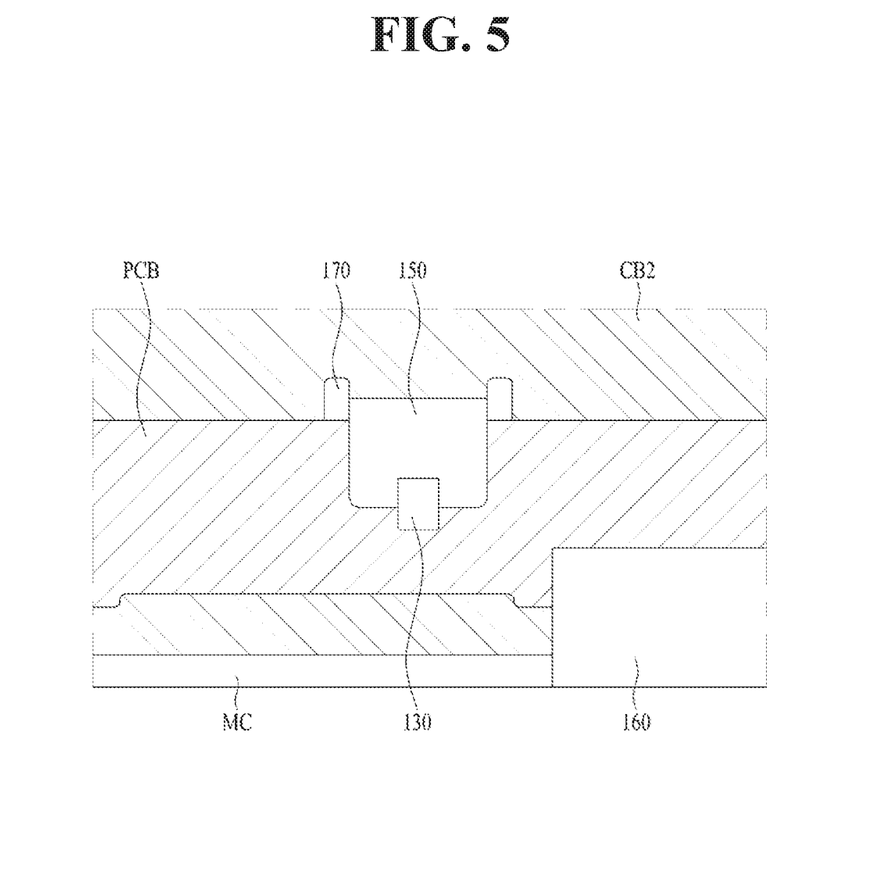
FIG. 5 is a plan view schematically illustrating a portion of the rear surface of the LCD including the electromagnetic wave shielding structure shown in FIGS. 3A to 3C.
Figure 6:
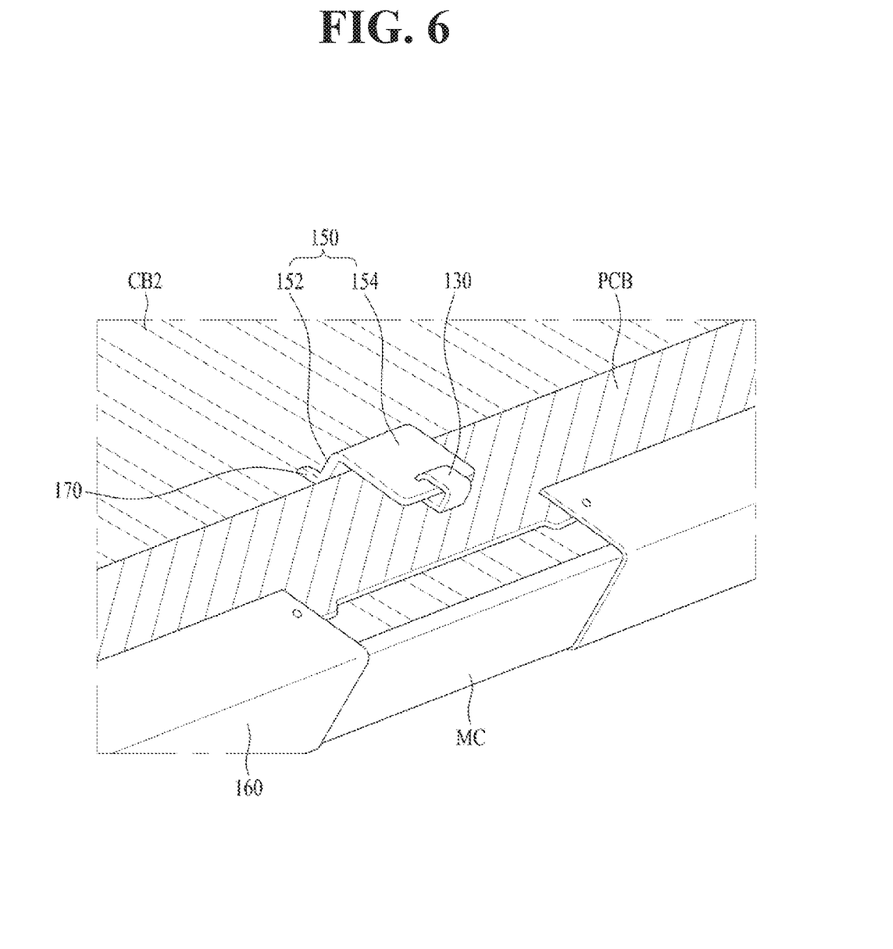
FIG. 6 is a perspective view schematically illustrating a portion of the rear surface of the LCD including the electromagnetic wave shielding structure shown in FIGS. 3A to 3C.
Figure 7:
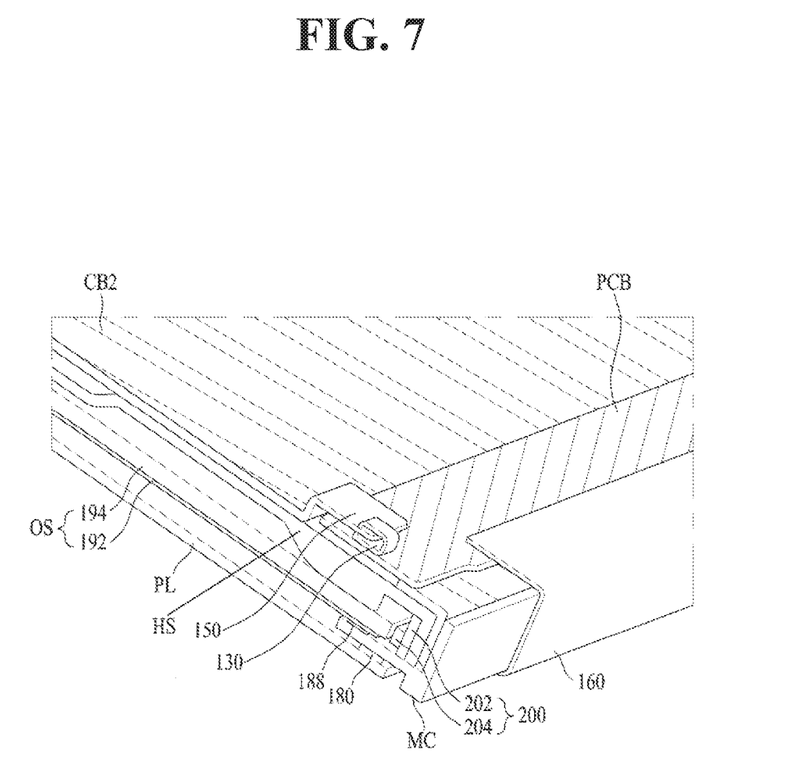
FIG. 7 is a perspective view schematically illustrating a portion of the LCD including the electromagnetic wave shielding structure shown in FIGS. 3A to 3C, together with the cross-sectional surface thereof.

FIG. 4 is an exploded perspective schematically illustrating an LCD according to an embodiment of the present invention. FIG. 5 is a plan view schematically illustrating a portion of the rear surface of the LCD including the electromagnetic wave shielding structure shown in FIGS. 3A to 3C. FIG. 6 is a perspective view schematically illustrating a portion of the rear surface of the LCD including the electromagnetic wave shielding structure shown in FIGS. 3A to 3C. FIG. 7 is a perspective view schematically illustrating a portion of the LCD including the electromagnetic wave shielding structure shown in FIGS. 3A to 3C, together with a cross-sectional surface thereof.

Referring to FIGS. 4 to 7, the LCD according to the present invention includes a liquid crystal panel PL, a driving unit IC, 160 and PCB for the liquid crystal panel PL, a middle cabinet MC, a backlight unit BL, a housing HS and first and second bottom covers CB1 and CB2.

The liquid crystal panel PL is constituted by upper and lower substrates, which are layered on each other with a liquid crystal layer disposed therebetween. One of the upper and lower substrates is provided with a color filter array, and the other of the upper and lower substrates is provided with a thin-film transistor array. Respective polarization plates (not shown) are attached to the outer surfaces of the upper and lower substrates. The inner surfaces of the upper and lower substrates, which are in contact with the liquid crystal, are respectively provided with oriented films for setting the pretilt angle of the liquid crystal. The liquid crystal panel PL displays an image via a pixel matrix on which a plurality of pixels are arranged. Each pixel is constituted by a combination of red/green/blue (R/G/B) sub-pixels, which control light transmissibility by variation of liquid crystal alignment in response to a data signal so as to realize a desired color. Each pixel may further include a white sub-pixel for increasing luminance. Each sub-pixel includes a thin film transistor (TFT), which is connected to a gate line and a data line, and a liquid crystal capacitor and a storage capacitor, which are connected in parallel to the TFT. The liquid crystal capacitor charge a voltage corresponding to the difference between a data signal supplied to a pixel electrode through the TFT and a common voltage supplied to a common electrode, and controls light transmissibility by driving the liquid crystal depending on the charged voltage. The storage capacitor ensures that a stable magnitude of voltage is supplied to the liquid crystal capacitor. The liquid crystal layer may be driven by a vertical electric field as in a twisted nematic (TN) mode or a vertical alignment (VA), or may be driven by a horizontal electric field as in an in-plane switching (IPS) mode or a fringe field switching (FFS) mode.

A circuit film 160, on which a data driver IC is mounted, is disposed between the liquid crystal panel PL and the PCB and is attached thereto. The data driver IC converts digital data, input from an external timing controller, into a positive/negative data signal using gamma voltage from a gamma voltage generator, and supplies the data signal to the data line every time each gate line is driven. The data driver IC is mounted on the circuit film 160 such as a tape carrier package (TCP), a chip on film (COF) or a flexible print circuit (FPC), and is attached to the liquid crystal panel PL and the PCB in a tape-automatic-bonding (TAB) manner.

A gate driver for driving gate lines of the liquid crystal panel PL is formed, along with a thin-film transistor array of the liquid crystal panel PL, on a thin-film transistor substrate through the same process in a gate-in-panel (GIP) manner, and is thus embedded in the liquid crystal panel PL.

The middle cabinet MC is shaped into a frame form so as to support the liquid crystal panel PL and to prevent movement of the backlight unit BL layered on the bottom covers CB1 and CB2. Referring to FIG. 7, the middle cabinet MC is provided on the upper side thereof with a panel-seating portion so as to receive the liquid crystal panel PL therein and to support the outer peripheral portion of the liquid crystal panel PL. A foam pad 180 is disposed between the rear surface of the liquid crystal panel PL and the panel-seating portion of the middle cabinet MC so as to attenuate external impacts to thus protect the liquid crystal panel PL. The middle cabinet MC receives the backlight unit BL under the panel-seating portion thereof. The middle cabinet MC is provided around the backlight unit BL with a lateral wall so as to prevent movement of the backlight unit BL. A light shielding pad 188 for blocking light leakage may further be provided between the rear surface of the panel-seating portion of the middle cabinet MC and the optical member OS of the backlight unit BL.

The backlight unit BL is disposed under the liquid crystal panel PL so as to provide the liquid crystal panel PL with light. The backlight unit BL includes a light source 200, the optical member OS layered on the bottom covers CB1 and CB2, and a housing HS, which is disposed between the bottom covers CB1 and CB2 and the optical member OS so as to support the light source 200 and the optical member OS.

Referring to FIG. 7, the light source 200 includes a circuit board 202 disposed inside the lateral wall of the housing HS, and an LED package 204 mounted on the circuit board 202 so as to face the lateral surface of a light guide plate 194.

The optical member OS includes a reflective sheet, layered on the bottom of the housing HS, the light guide plate 194, and an optical sheet 192. The light guide plate 194 converts incident light, introduced from the LED package 204, into light having a surface light source shape. The optical sheet 192 collects and defuses light introduced from the light guide plate 194 so as to cause the light to be introduced into the liquid crystal panel L in a direction perpendicular to the liquid crystal panel PL. The reflective sheet reflects the light, directed toward the rear surface of the light guide plate 194, to the light guide plate 194.

The bottom covers CB1 and CB2 may include a non-conductive bottom cover CB1 and a conductive bottom cover CB2. The bottom of the housing HS is provided with protrusions so as to isolate the optical member OS from the bottom covers CB1 and CB2. The bottom of the housing HS may be positioned only between the second bottom cover CB2, made of a conductive material, and the optical member OS. The lateral wall of the conductive bottom cover CB2 may be disposed and held between the lateral wall of the housing HS and the lateral wall of the middle cabinet MC.

Referring to FIGS. 5 to 7, the circuit film 160, which is disposed between the liquid crystal panel PL and the PCB and is attached thereto, is bent along the outer surface of the middle cabinet MC, so that the PCB, on which the gasket 130 is mounted, is seated on the rear surface of the conductive bottom cover CB2. By virtue of the coupling structure between the gasket 130 mounted on the PCB and the conductive holder 150 mounted on the conductive bottom cover CB2, the ground path is formed between the PCB and the conductive bottom cover CB2.

As described above with reference to FIG. 3, the gasket 130 is mounted on the PCB so as to come into electric contact with the ground pad 142 of the PCB. A plurality of gaskets 130 may be mounted on the PCB.

The vertical part 152 of the conductive holder 150 mounted on the conductive bottom cover CB is positioned near the end of the PCB, and the horizontal part 154 of the conductive holder 150 is positioned parallel to the surface of the PCB. The horizontal part 154 of the conductive holder 150 is inserted into the internal space 136 in the gasket 130 through the opening 140 in the gasket 130, so that the gasket 130 and the conductive holder 150 are coupled to each other and the conductive holder 150 comes into electric contact with the conductive member 132 applied to the inner surface of the gasket 130.

Referring to FIGS. 5 and 6, when the conductive holder 150 is integrally formed with the conductive bottom cover CB2, the conductive bottom cover CB2 may be partially cut into a U-shaped slit 170 as to form a wing portion, and the wing portion may be bent twice, that is, upwardly and horizontally so as to form the vertical part 152 and the horizontal part 154.

Accordingly, by virtue of the coupling structure between the gasket 130 and the conductive holder 150, the PCB may be held on the conductive bottom cover CB2. In addition, since there is formed a ground path, which extends through the ground pad 142 of the PCB, the conductive member 132 of the gasket 130, the conductive holder 150 and the conductive bottom cover CB, it is possible to block electromagnetic waves generated in the PCB or the like even without using a cover shield.

As described above, in the electromagnetic wave shielding structure according to the present invention, the conductive holder mounted on the conductive cover is inserted into and coupled to the internal space of the gasket mounted on the circuit board, and comes into contact with the inner conductive member of the gasket. As a result, by virtue of the coupling structure between the conductive holder and the gasket, the circuit board can also be held. In addition, it is possible to block electromagnetic waves using the ground path formed between the circuit board and the conductive cover.

Consequently, the display device including the electromagnetic wave shielding structure according to the present invention is able to obviate a cover shield, which comes into contact with the outer conductive member of the gasket and to obviate or minimize holding members for holding the circuit board to the conductive cover, thereby reducing manufacturing costs and increasing design freedom.

Alternatively, the display device including the electromagnetic wave shielding structure according to the present invention may further include a cover shield, which comes into contact with the outer conductive film of the gasket. In this case, the surface area of the ground path is increased, thereby improving grounding performance.

Although the present invention has been described based only on the case in which the electromagnetic wave shielding structure is applied to an LCD, the present invention is not limited to the LCD, and may be applied to various display devices and various electronic appliances such as computers.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. An electromagnetic wave shielding structure, comprising:
    a conductive cover;
    a circuit board disposed on a surface of the conductive cover;
    a gasket mounted on the circuit board to electrically contact the circuit board, the gasket having therein an opening; and
    a conductive holder, which protrudes from the conductive cover to be inserted through the opening in the gasket and is coupled thereto, the conductive holder electrically contacting the gasket,
    wherein the gasket comprises:
        an elastic member having the opening and an internal space communicating with the opening, and
        a conductive member applied to outer and inner surfaces of the elastic member, and
    wherein:
        the conductive member applied to the outer surface of the elastic member and the conductive member applied to the inner surface of the elastic member are connected to each other,
        the conductive member applied to the outer surface of the elastic member electrically contacts the circuit board,
        the conductive member applied to the inner surface of the elastic member electrically contacts the conductive holder inserted through the opening,
        the circuit board on the conductive cover is held on the conductive cover by the coupling structure such that the conductive holder protruded from the conductive cover is inserted through the opening in the gasket to be coupled to the gasket,
        the conductive holder electrically contacts the conductive member on both sides of the opening in the gasket, and
        the conductive holder is spaced apart from at least one of the inner surfaces of the gasket in the internal space of the gasket.

2. The electromagnetic wave shielding structure according to claim 1, wherein:
    the opening is positioned in a lower part of the gasket, which contacts a ground pad on the circuit board;
    the circuit board has a through hole communicating with the opening in the gasket; and
    the conductive holder projecting from the conductive cover is inserted in the internal space in the gasket through the through hole in the circuit board and the opening in the gasket to directly contact the conductive member applied to the opening in the gasket and to hold the circuit board to the conductive cover.

3. The electromagnetic wave shielding structure according to claim 1, wherein:
    the gasket comprises:
        a lower part contacting a ground pad on the circuit board;
        an upper part facing the lower part; and
        two lateral wall parts connected to each other via the lower part and the upper part;
    the opening in the gasket is positioned in one of the two lateral wall parts; and
    the conductive holder projecting from the conductive cover is disposed near an end of the circuit board and is inserted into the internal space in the gasket through the opening in the gasket to directly contact the conductive member applied to the opening of the gasket and to hold the circuit board to the conductive cover.

4. The electromagnetic wave shielding structure according to claim 1, wherein:
    the conductive holder includes a vertical part and a horizontal part; and
    one of the vertical part and the horizontal part of the conductive holder directly contacts the conductive member applied to the opening of the gasket.

5. The electromagnetic wave shielding structure according to claim 4, wherein the conductive holder is constituted by a wing portion, the wing portion being integrally formed at a portion thereof with the conductive cover and being separated at a remaining portion thereof from the conductive cover, and the wing portion having the vertical part and the horizontal part.

6. A display device, comprising:
    a display panel;
    a conductive cover disposed behind the display panel;
    a circuit board electrically connected to the display panel via a circuit film including a driver mounted thereon, the circuit board being disposed on an outer surface of the conductive cover;

a gasket mounted on the circuit board to electrically contact the circuit board, the gasket having therein an opening; and a conductive holder projecting from the conductive cover and being inserted through the opening in the gasket to be coupled to the gasket, the conductive holder electrically contacting the gasket, wherein the gasket comprises:
an elastic member having the opening and an internal space communicating with the opening; and
a conductive member applied to outer and inner surfaces of the elastic member, and wherein:
the conductive member applied to the outer surface of the elastic member and the conductive member applied to the inner surface of the elastic member are connected to each other,
the conductive member applied to the outer surface of the elastic member electrically contacts the circuit board,
the conductive member applied to the inner surface of the elastic member electrically contacts the conductive holder inserted through the opening,
the circuit board on the conductive cover is held on the conductive cover by the coupling structure such that the conductive holder protruded from the conductive cover is inserted through the opening in the gasket to be coupled to the gasket,
the conductive holder electrically contacts the conductive member on both sides of the opening in the gasket, and
the conductive holder is spaced apart from at least one of the inner surfaces of the gasket in the internal space of the gasket.

7. The display device according to claim 6, wherein:
the opening is positioned in a lower part of the gasket, which contacts a ground pad on the circuit board;
the circuit board has a through hole communicating with the opening in the gasket; and
the conductive holder projecting from the conductive cover is inserted in the internal space in the gasket through the through hole in the circuit board and the opening in the gasket to directly contact the conductive member applied to the opening in the gasket and to hold the circuit board to the conductive cover.

8. The display device according to claim 6, wherein:
the gasket comprises:
a lower part contacting a ground pad on the circuit board;
an upper part facing the lower part; and
two lateral wall parts connected to each other via the lower part and the upper part;
the opening in the gasket is positioned in one of the two lateral wall parts; and
the conductive holder projecting from the conductive cover is disposed near an end of the circuit board and is inserted into the internal space in the gasket through the opening in the gasket to directly contact the conductive member applied to the opening in the gasket and to hold the circuit board to the conductive cover.

9. The display device according to claim 6, wherein:
the conductive holder includes a vertical part and a horizontal part;
one of the vertical part and the horizontal part of the conductive holder directly contacts the conductive member applied to the opening in the gasket; and
the conductive holder is constituted by a wing portion, the wing portion being integrally formed at a portion thereof with the conductive cover and being separated at a remaining portion thereof from the conductive cover, and the wing portion having the vertical part and the horizontal part.

10. The display device according to any of claims 6 to 9, further comprising:
a middle cabinet on which the display panel is mounted;
a backlight unit disposed on the conductive cover and received in a lower part of the middle cabinet; and
a non-conductive cover disposed behind the backlight unit and separated from the conductive cover.

* * * * *